United States Patent
Smith

(10) Patent No.: US 10,240,252 B2
(45) Date of Patent: Mar. 26, 2019

(54) EPITAXIAL QUARTZ HOMEOTYPES CRYSTAL GROWTH ON BETA QUARTZ FOR PRESSURE SENSORS AND ACCELEROMETERS

(71) Applicant: Daniel Smith, Northridge, CA (US)

(72) Inventor: Daniel Smith, Northridge, CA (US)

( * ) Notice: Subject to any disclaimer, the term of this patent is extended or adjusted under 35 U.S.C. 154(b) by 208 days.

(21) Appl. No.: 15/530,412

(22) Filed: Jan. 10, 2017

(65) Prior Publication Data
US 2018/0195202 A1 Jul. 12, 2018

(51) Int. Cl.
| | | |
|---|---|---|
| *C30B 19/12* | (2006.01) | |
| *C30B 19/08* | (2006.01) | |
| *C30B 7/10* | (2006.01) | |
| *C30B 19/02* | (2006.01) | |
| *C30B 25/18* | (2006.01) | |
| *C30B 29/18* | (2006.01) | |
| *C30B 29/14* | (2006.01) | |
| *C30B 29/22* | (2006.01) | |
| *C30B 23/02* | (2006.01) | |
| *H01L 41/187* | (2006.01) | |
| *H01L 41/316* | (2013.01) | |
| *H01L 41/317* | (2013.01) | |

(52) U.S. Cl.
CPC ............... *C30B 19/12* (2013.01); *C30B 7/10* (2013.01); *C30B 19/02* (2013.01); *C30B 19/08* (2013.01); *C30B 23/02* (2013.01); *C30B 25/18* (2013.01); *C30B 29/14* (2013.01); *C30B 29/18* (2013.01); *C30B 29/22* (2013.01); *H01L 41/187* (2013.01); *H01L 41/1875* (2013.01); *H01L 41/316* (2013.01); *H01L 41/317* (2013.01)

(58) Field of Classification Search
CPC ............ C30B 19/12; C30B 7/10; C30B 19/02; C30B 19/08; C30B 23/02; C30B 25/18; C30B 29/14; C30B 29/18; C30B 29/22; H01L 41/187; H01L 41/1875; H01L 41/316; H01L 41/317
See application file for complete search history.

(56) References Cited

U.S. PATENT DOCUMENTS 5,440,188 A * 8/1995 Krempl ............. H03H 9/02574
310/313 A

OTHER PUBLICATIONS

Pedarnig et al., "Growth and Thermal Stability of GaPO4 epitaxial thin films", Applied Physics Letters, vol. 89, 2009, p. 241912. (Year: 2009).*
Chebil et al., "Epitaxial growth of ZnO on quartz substrate by sol gel spin coating method"), Superlattice and Micrstructures, vol. 95, pp. 48-55, 2016. (Year: 2016).*

* cited by examiner

*Primary Examiner* — Jonathan C Langman

(57) ABSTRACT

The purpose of quartz homeotypes grown epitaxially on beta quartz for use in pressure sensors or accelerometers is to be able to drastically cut down production costs on otherwise expensive or time-consuming to grow crystals that are necessary in various industrial applications. This is done via epitaxial growth of quartz homeotypes across the whole surface of a sample of beta quartz, an easily accessible and high temperature capable crystal. This invention also applies to the epitaxial application of piezoelectric material atop a piezoelectric crystal for the purpose of altering its piezoelectric coefficient and the epitaxial application of a piezoelectric crystal atop a host crystal for the purpose of increasing its insulation resistance.

1 Claim, 2 Drawing Sheets

EPITAXIAL QUARTZ HOMEOTYPES CRYSTAL GROWTH ON BETA QUARTZ FOR PRESSURE SENSORS AND ACCELEROMETERS

CROSS-REFERENCE TO RELATED APPLICATION

NOT APPLICABLE

FEDERALLY SPONSORED RESEARCH

NOT APPLICABLE

SEQUENCE LISTING OR PROGRAM

NOT APPLICABLE

BACKGROUND

Field of Invention

This invention relates to single crystal growth of a thin layer of a piezoelectric quartz homeotype crystal, such as Gallium Orthophosphate, Gallium Arsenate, Barium Zinc Oxide, Aluminum Phosphate, and others; on beta quartz single crystal, with the proper orientation to be used in various instruments such as accelerometers or pressure sensors.

Prior Art

Industrial hydrothermal crystal growth and other methods for crystal growth are exceptionally time consuming and require the utilization of a great amount of resources, electricity and personnel, for proper operation. Generally, in laboratories and research and development teams, scientists have the tendency to prefer the most high-quality crystals possible. However, in industrial applications, a balance is required between performance, quality, and crystal growth time. In said industrial applications, the highest quality crystal possible is not necessarily required, therefore meaning that a new method of crystal growth is required to more perfectly strike this balance. It is possible to sacrifice some minor degree of quality to achieve a more economical growth time while still maintaining a working crystal. One existing way to increase the growth rate of hydrothermal crystals is to increase the temperature differential between the growth zone and the dissolving zone. However, this results in a product that is of lower quality than what can be produced via my invention. That is, the application of a thin layer of a piezoelectric quartz homeotype crystal, such as Gallium Orthophosphate, Gallium Arsenate, Barium Zinc Oxide, Aluminum Phosphate, and others; on beta quartz single crystal, with the proper orientation to be used in various instruments such as accelerometers or pressure sensors. By applying a layer just thick enough for the task required of it, an immense amount of time can be saved, a potential decrease of time from up to a year or more to just over a week. Ensuring proper orientation before layer application ensures that the newly coated crystal is ready for use immediately after processing.

Further, the use of beta quartz is imperative for the practicality of the method, both being an easily available base for epitaxial growth, but also behaving as a piezoelectric crystal capable of withstanding higher temperatures, contrary to widely adopted alpha quartz, greatly increasing the possible quartz homeotypes that can be grown in this fashion. Another important factor in the use of beta quartz is that beta quartz has the property of having high insulation resistance, something that is critical for the success of the process. Also importantly, beta quartz has low piezoelectric coefficients that can be overwritten by the piezoelectric coefficients of the layered crystal.

SUMMARY

The invention, the application of a thin layer of a piezoelectric quartz homeotype crystal, such as Gallium Orthophosphate, Gallium Arsenate, Barium Zinc Oxide, Aluminum Phosphate, and others; on beta quartz single crystal, with the proper orientation to be used in various instruments such as accelerometers or pressure sensors, is intended to deliver piezoelectric crystals of sufficient quality for industrial use in a greatly reduced amount of time. The intended effect of the process is for a quartz homeotype with the desired qualities be grown epitaxially on the surface of beta quartz, with the layer being just thick enough for effective use. By not growing a full quartz homeotype crystal from a seed, but instead growing it as an epitaxial layer, the waste of excess material is avoided and the cost of the process goes down significantly.

BRIEF DESCRIPTION OF THE DRAWINGS

The foregoing and other objects, features, and advantages of my invention will be apparent from the following more particular description of a preferred embodiment of the invention, as illustrated in the accompanying drawings. The drawings are not necessarily made to scale, but instead are used to detail the nature and principle of the invention. The preferred embodiment(s) of the present invention is/are described in conjunction with the associated drawings in which like features are indicated with like reference numerals and in which.

DESCRIPTION OF THE EMBODIMENTS

Figure 1A:
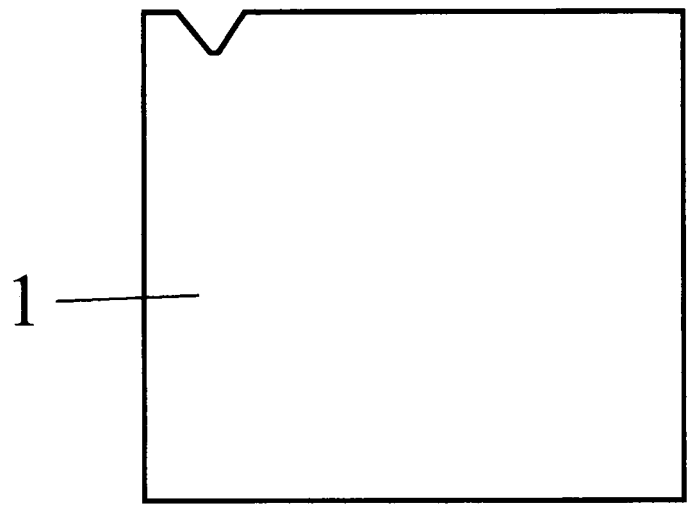
FIG. 1A is a frontal view of a square host crystal 1 blank before application of the epitaxial layer. It is a typical example of the types of crystal blanks used in the accelerometer and pressure sensor industry with the distinctive notch designating its Z-axis.
Figure 1B:
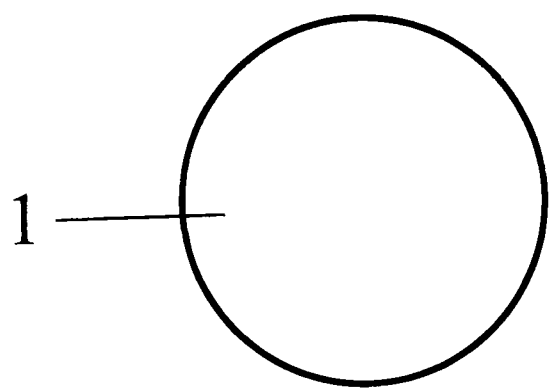
FIG. 1B is a frontal view of a circular host crystal blank 1 before application of the epitaxial layer. It too, is an example of the types of crystal blanks used in the accelerometer and pressure sensor industry.
Figure 2A:
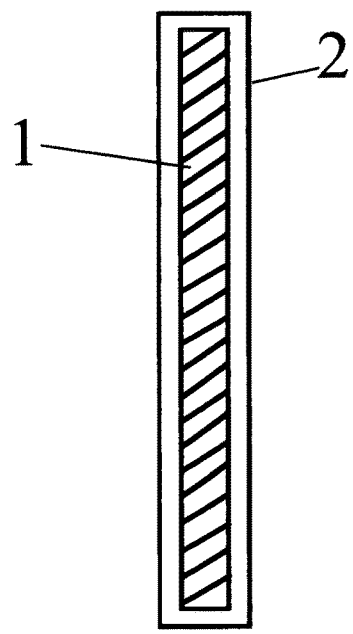
FIG. 2A is a side cross section of a square host crystal 1 blank after application of the epitaxial layer 2.
Figure 2B:
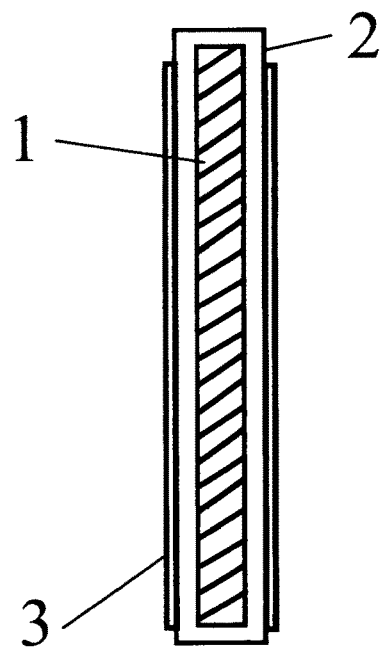
FIG. 2B is a side cross section of a square host crystal 1 blank after application of the epitaxial layer with the addition of metal electrodes 3 on the blank's sides.

On one of the embodiments, a layer of quartz homeotypes 2 is grown epitaxially on a sample of beta quartz crystal 1, a crystal chosen for this invention for its high temperature performance. This layer 2 allows for an immense amount of time to be saved in industrial production, a potential decrease of time from up to a year or more to just over a week, as the crystal product will have the same applications as a fully grown quartz homeotype, yet require far less growth. Essentially, this technology will serve as a disruptive technology, one that may not be the end all solution to growing quartz homeotypes for industrial use in bulk, but one that achieves the better balance among quality, cost, growth time that the industry needs. These quartz homeotypes used for the epitaxial layer 2 include Gallium Arsenate, Gallium Orthophosphate, Barium Zinc Oxide, and Aluminum Phosphate. Further, the layer 1 thickness can vary as needed for different applications, itself ranging from very thin to extraordinarily thick. Generally, a thinner layer will be required for most industrial applications, though it is important to have flexibility in application. The methods used for growing the epitaxial layer 2 are the same as those employed for the conventional growth of such quartz homeotypes, including the hydrothermal crystal growth method, flux crystal growth method, and vapor chemical deposition crystal growth method. Using these methods, the quartz homeotype layer 2 can thus be grown using existing industrial equipment.

A further important component of this technology is the ability for a piezoelectric crystal to have its ultimate piezoelectric coefficient altered by an epitaxial layer of a different piezoelectric material, something that allows for differing combinations of crystal properties not developed for industrial use before. Similar in application to the epitaxial layer 2 of quartz homeotypes, this layering of piezoelectric material to change the piezoelectric coefficient can be done completely or incompletely across the surface of the host crystal 1 with added electrodes 3 as well as layered in varying thicknesses or by differing methods as required by industrial needs. It is also important to note the potential for applying piezoelectric crystals epitaxially onto non-piezoelectric host crystals. Further, when speaking about the invention as it pertains to piezoelectric layers applied to host crystals for the purpose of altering the piezoelectric coefficient, beta quartz is no longer required as the host crystal, allowing for piezoelectric crystals of different crystallographic symmetries such as PMN or Lithium Niobate to be applied epitaxially. PMN crystals for example are used in high sensitivity sonar technologies and accordingly are very expensive to grow in bulk. Applying them epitaxially according to this invention could make them more affordable, while keeping their important characteristics. The latter example, Lithium Niobate, is generally cheap to grow from the melt and possesses a high piezoelectric coefficient, but low insulation resistance. Using my invention, this crystal can be applied epitaxially upon another host crystal with higher insulation resistance to achieve a final product with the best qualities of both crystals. Finally, the technology can also be applied to using an epitaxial layer 2 of a piezoelectric crystal atop a host crystal 1 for the purpose of increasing its insulation resistance, allowing for a greater variety of materials to be used in different industrial applications.

I claim:

1. A piezoelectric crystal in which a layer of a quartz homeotype, made with Barium Zinc Oxide, is grown epitaxially on a substrate sample of beta quartz.

* * * * *